United States Patent [19]

Ruppel et al.

[11] 4,259,365
[45] Mar. 31, 1981

[54] METHOD FOR CREATING A FERROELECTRIC OR PYROELECTRIC BODY

[76] Inventors: Wolfgang Ruppel, Stolper Strasse 6a; Ullrich Hetzler, Machstrasse 11; Horst Vogt, Roonstrasse 17; Peter Wurfel, Schneidemuhler Str. 24b, all of Karlsruhe, Fed. Rep. of Germany

[21] Appl. No.: 882,796

[22] Filed: Mar. 2, 1978

[51] Int. Cl.³ .............................................. B05D 3/02
[52] U.S. Cl. .................................... 427/46; 23/302 T; 156/622; 156/624; 427/45.1; 427/64; 427/72; 427/93; 427/100; 427/241; 427/292; 427/319; 427/374.1; 427/374.4; 427/398.1; 427/405; 427/427; 427/431; 427/436; 428/910; 428/913
[58] Field of Search .................. 427/7, 46, 64, 72, 100, 427/241, 292, 85, 93, 82, 374 F, 398 R, 374.1, 374.4, 398.1, 405, 427, 431, 436, 45.1, 319; 148/171, 172, 173, 176, 183, 31.5; 29/571; 156/622, 624; 365/65, 117, 145; 23/302 T; 428/1, 910, 913; 423/385; 252/62.9; 423/385

[56] References Cited

U.S. PATENT DOCUMENTS

| | | | |
|---|---|---|---|
| 1,975,078 | 10/1934 | Boughton | 106/286.7 X |
| 2,016,274 | 10/1935 | Boughton | 106/286.7 X |
| 2,456,393 | 12/1948 | Duncan | 423/385 |
| 3,075,386 | 1/1963 | Daly | 29/573 |
| 3,261,671 | 7/1966 | De Jonge et al. | 427/82 X |
| 3,303,399 | 2/1967 | Hoogendoorn et al. | 427/82 X |
| 3,514,844 | 6/1970 | Bower et al. | 29/584 X |
| 3,571,592 | 3/1971 | Glass | 73/356 X |
| 3,676,921 | 7/1972 | Kooi | 29/571 |
| 3,733,499 | 5/1973 | Deis et al. | 357/28 X |
| 3,816,750 | 6/1974 | Liu | 252/62.9 X |
| 3,874,915 | 4/1975 | Ono et al. | 427/85 |
| 3,965,247 | 6/1976 | Hecklinger et al. | 423/385 |
| 3,977,934 | 8/1976 | Lesk | 427/82 X |
| 4,047,214 | 9/1977 | Francombe et al. | 357/4 X |
| 4,101,925 | 7/1978 | Kelley et al. | 29/572 X |
| 4,119,744 | 10/1978 | Brissot et al. | 427/46 X |

FOREIGN PATENT DOCUMENTS 1521952  6/1972  Fed. Rep. of Germany ......... 427/D85

OTHER PUBLICATIONS

"A New Ferroelectric Memory Device, Metal Ferroelectric-Semiconductor Transistor", IEEE Transactions on Electron Devices, vol. ED-21, No. 8, Aug. 1974.
F. Jona et al., *Ferroelectric Crystals*, MacMillan Co., N.Y., (1962), pp. 361–363.

*Primary Examiner*—Ronald H. Smith
*Assistant Examiner*—Thurman K. Page
*Attorney, Agent, or Firm*—Marianne Rich

[57] ABSTRACT

Sodium nitrite in liquid form is deposited on a substrate and allowed to crystallize thereby forming a thin layer on the substrate. The substrate is either dipped into a solution containing sodium nitrite or into sodium nitrite in the molten state and then pulled out again. Subsequent drying or cooling of the wetted substrate top surface causes the crystalline film to form. Alternatively, sodium nitrite in a liquid state is applied to the top surface of the substrate and the substrate is rotated to assure an even distribution of the sodium nitrite. Again, drying or cooling causes the crystalline layer to form. The so manufactured unit is shown as part of a pyroelectric radiation detector, as image receiver in a television camera tube and as the storage element in a field effect transistor arrangement.

30 Claims, 7 Drawing Figures

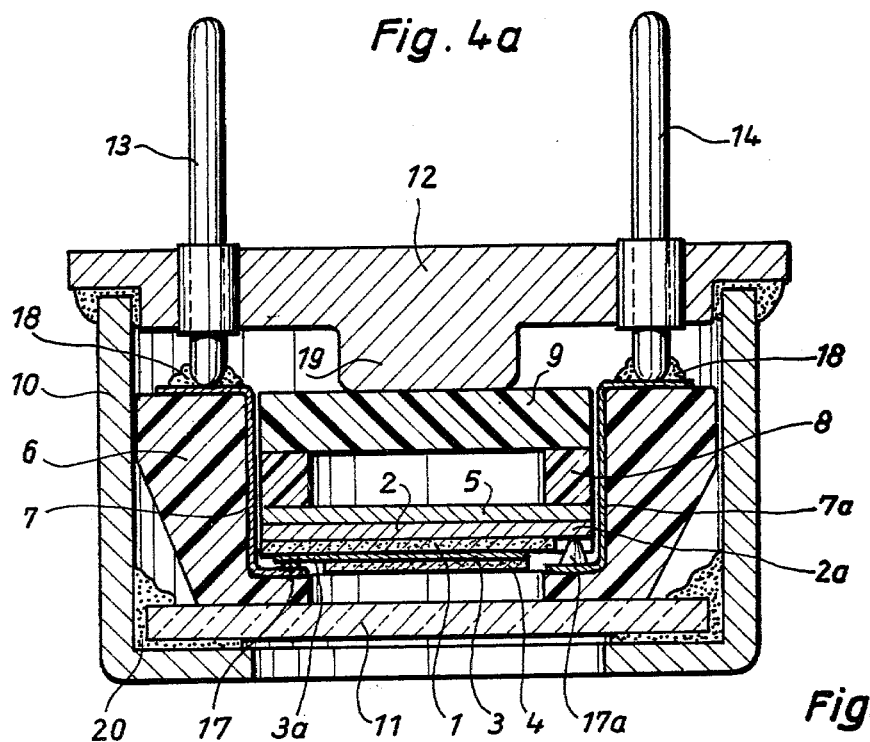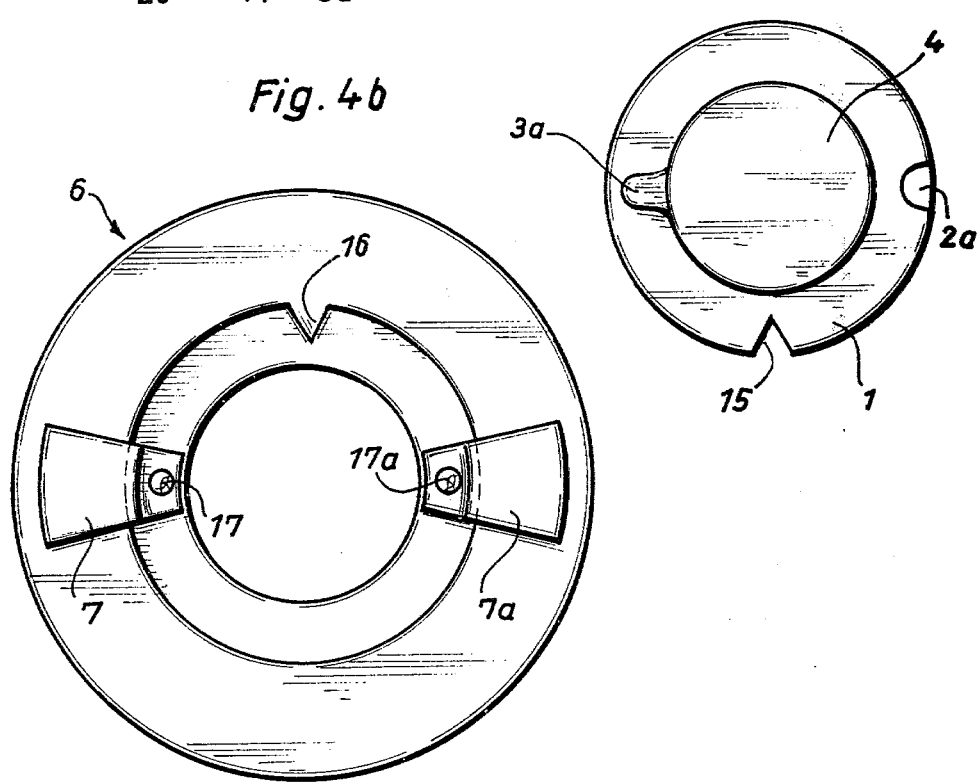

METHOD FOR CREATING A FERROELECTRIC OR PYROELECTRIC BODY

The present invention relates to a method for manufacturing a ferroelectric or pyroelectric building block in which the ferroelectric material in a liquid state is deposited on a substrate to form a thin crystalline film or layer.

BACKGROUND AND PRIOR ART

The French patent publication No. 2,130,629 discloses a method wherein triglycine sulfate is utilized as a ferroelectric or pyroelectric material. The triglycine sulfate, in the form of a fine suspension in a liquid in which it is not soluble, is deposited on the top surface of the substrate by a simultaneous application of an electric field.

Further, measurements made on large sodium nitrite crystals (F. Jona, G. Shirane, Ferroelectric Crystals, Pergamon Press 1962), indicate that sodium nitrite is a ferroelectric material. However, sodium nitrite has, up to now, not been taken into consideration for the manufacture of solid ferroelectric or pyroelectric building blocks, because no advantages relative to the known ferroelectric materials such as barium titanate and triglycine sulfate were recognized.

THE INVENTION

It is an object of the present invention to furnish a method for manufacturing ferroelectric or pyroelectric building blocks which is simple, economic, and results in thin films of good ferroelectric and pyroelectric characteristics. It is a further object of the present invention to furnish the solid building block manufactured by the method, and apparatus utilizing same.

Briefly, the present invention comprises the steps of depositing sodium nitrite in a liquid form on a substrate, and crystallizing the sodium nitrite, thereby creating a film of sodium nitrite on the substrate. The sodium nitrite in liquid form may be sodium nitrite in a molten state or a solution containing sodium nitrite.

In a particularly simple form of the method, the substrate is dipped into the sodium nitrite in the molten state or in solution and is subsequently pulled out of the sodium nitrite solution, subsequent cooling or drying of the moistened top surface of the substrate causing the crystalline layer to form. Alternatively, the sodium nitrite is applied to the top surface of the substrate in liquid form and the substrate is then rotated to cause an even distribution of the liquid. Again, subsequent drying or cooling of the moistened top surface causes the crystalline sodium nitrite layer to form.

The so manufactured solid body can be used in a number of applications including, for example, as a pyroelectric radiation detector, as a target in a television camera or as storage element in an MIS-field effect transistor arrangement.

The present invention, both as to its construction and its method of operation, together with additional objects and advantages thereof, will best be understood from the following description of preferred embodiments when read in connection with the accompanying drawing.

BRIEF DESCRIPTION OF THE DRAWINGS

FIG. 4a, 4b, 4c show a preferred embodiment of an infrared detector in accordance with the present invention.

Figure 1:
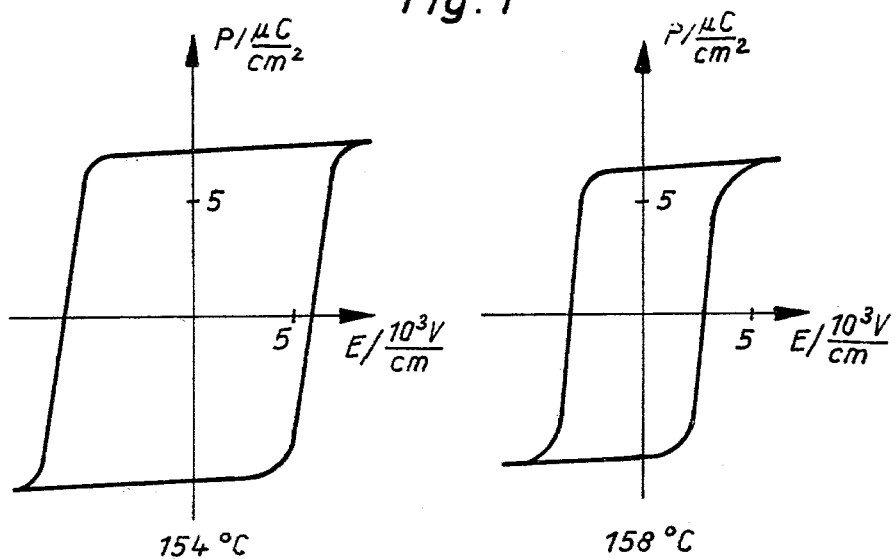
FIG. 1 is a plot of the dielectric polarization of a sodium nitrite film as a function of electric field for two different temperatures.

Several methods of forming a sodium nitrite layer on a substrate will first be discussed. In the first, 300 grams of analytic grade sodium nitrite were melted in a 200 ml beaker. The beaker was covered with a heating coil on its bottom and sides so that the sodium nitrite melt would be maintained at the most uniform temperature possible. The heating power was regulated by a temperature regulator in such a way that the temperature of the melt varied by less than 0.1 degrees centigrade. The melt was kept above the melting point for one day prior to the manufacture of the first sodium nitrite layer.

Mica, having an $SnO_2$ layer as electrode on one of its sides, was utilized as substrate. In order to apply the electrode to the mica substrate, the substrate was heated to approximately 400 degrees centigrade and sprayed with a mixture of $SnCl_4$, methanol, $H_2O$ and HCl. This causes a layer of a thickness of less than one $\mu m$ of chlorine doped tindioxide (herein after called a tindioxide layer) to be formed. The mica substrate with the tindioxide layer was clamped in a holder and dipped into the sodium nitrite. It remained in the sodium nitrite for several hours, whereby the top surface of the tin dioxide layer was cleaned. Thereafter the holder with the substrate was pulled out of the sodium nitrite melt with a speed of approximately 1 mm/sec by means of a synchronous motor with suitable gearing. The film that clung to the substrate was only several $\mu m$ thick. This film crystallized at a distance of several millimeters over the top surface of the sodium nitrite melt. The temperature at the surface of the melt was kept about 5 degrees centigrade above the solidification point of the melt. It was found that the thickness of the sodium nitrite film crystallized on the substrate and the uniformity of the crystal structure depend critically on the temperature of the melt, and particularly on the temperature at the top surface of the melt, as well as on the speed with which the substrate is withdrawn from the melt. Increasing the temperature of the melt causes thinner but less uniform layers to form. An increase in the withdrawal speed also leads to less uniformly crystallized layers.

In a second method, the mica substrate with the tin dioxide layer was of a shape symmetrical to an axis of rotation and was mounted in a rotatable holder. Specifically, a vacuum pump was used to suck the substrate through a bore in the axis of the holder against a perforated plate. Hot air was then blown against the substrate to raise its temperature to a temperature only slightly below the melting point of sodium nitrite. The blowing of hot air took place in rings, so that the temperature was lowest at the center of rotation of the substrate. A drop of molten sodium nitrite at a temperature of approximately 5 degrees centigrade above the melting point was then dropped onto the center of the rotating substrate. At 50 to 100 rotations per second, a drop of sodium nitrite was hurled outwards in such a way that a uniform sodium nitrite film of approximately 1 μm thickness was formed. Since the temperature was the lowest at the center of rotation, the crystallization started at the center and then proceeded outward.

In a third embodiment of the method of the present invention, a solution of sodium nitrite was substituted for the molten sodium nitrite mentioned above. $H_2O$ constitutes a good solvent. To produce a sodium nitrite solution, 120 g sodium nitrite was stirred into 100 cubic centimeters $H_2O$ at a temperature of 50 degrees centigrade. A saturated sodium nitrite solution resulted, as well as some bottom sediments of sodium nitrite. Uniform thin films could be obtained either by dipping the substrate into the 50 degrees centigrade solution and then withdrawing it from the solution, or by putting a drop of the 50 degrees centigrade solution onto a rotating substrate warmed to 40 degrees centigrade. In both cases the speed of crystallization could be controlled within certain limits by the temperature and the humidity of the surrounding air.

Figure 3:
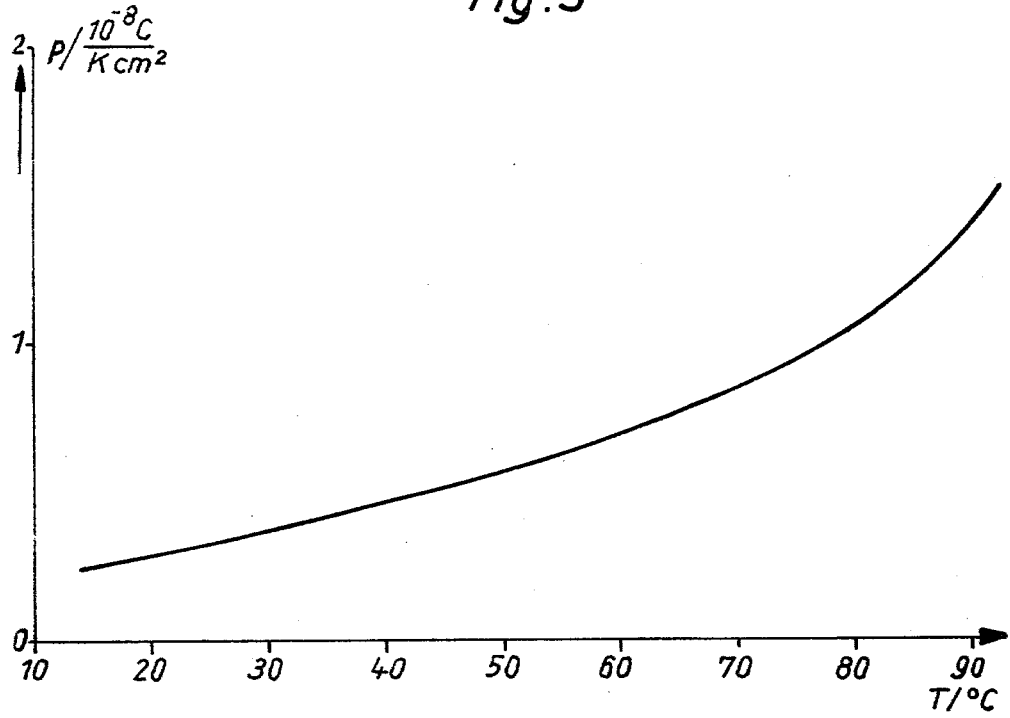
FIG. 3 is a plot of pyroelectric coefficient as a function of temperature for the sodium nitrite element manufactured in accordance with the present invention.
Figure 2:
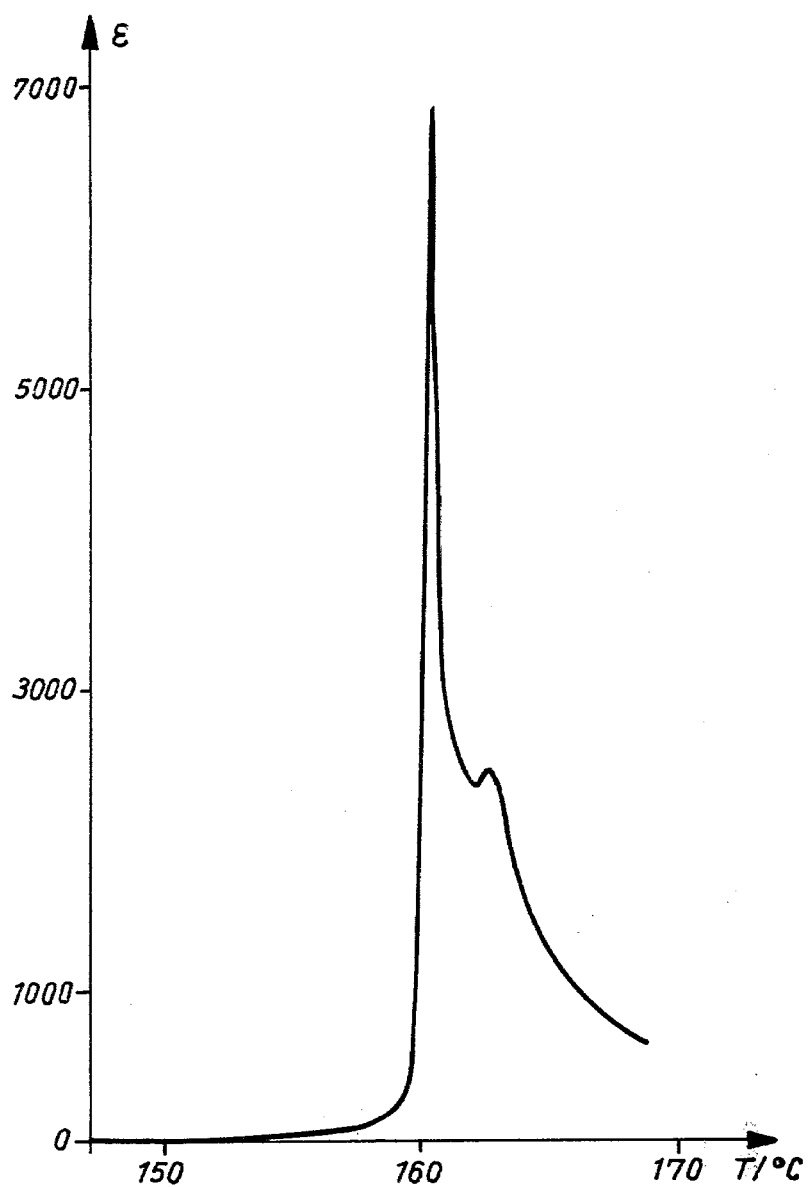
FIG. 2 is a plot of the dielectric constant as a function of temperature for a sodium nitrite body produced by the method of the present invention.

The results of measurements conducted on a ferroelectric building block or sensing element as manufactured by the method described in example 1 above are shown in FIGS. 1 to 3.

FIG. 1 shows the variation of the dielectric polarization P of the sodium nitrite layer as a function of electric field strength E. The characteristic hysteresis curve for ferroelectric material results. The spontaneous polarization P for a field strength E=0 is approximately 7 μcoulombs per square centimeter at a temperature T=154 degrees centigrade and 6 μcoulombs per square centimeter for a temperature T=158 degrees centigrade. The spontaneous polarization thus decreases with increasing temperatures. At the Curie temperature, $T_c$, it disappears entirely. This temperature is slightly above 160 degrees centigrade for sodium nitrite crystals. The appearance of a spontaneous polarization below the temperature $T_c$ is typical for ferroelectric material.

A dielectric constant $\epsilon$ of ferroelectric material is known to show a sharp rise in the vicinity of the Curie temperature $T_c$. In FIG. 2, the dielectric constant of the sodium nitrite building block is plotted as a function of temperature. It is to be noted that it has a sharp maximum at approximately 160 degrees centigrade, the Curie temperature of sodium nitrite.

The change in spontaneous polarization P as a function of temperature T is called the pyroelectric coefficient p. FIG. 3 shows the variation of p of the sodium nitrite layer of the solid body manufactured in accordance with the present invention as a function of temperature. p is a measure for the charge which flows through an external circuit in response to a change of temperature of the layer, such as might be caused by incident radiation. The charge can thus be used to indicate such a temperature change and thus the presence of such incident radiation.

The figure of merit of a pyroelectric material is given by $p/c\sigma\epsilon$ (E. H. Putley in "Semiconductors and Semimetals", edited by R. K. Willardson & A. C. Beer, 1970, Vol. 5, p. 266). Here c is the specific heat, $\sigma$ the mass density, and $\epsilon$ the dielectric constant. For the sodium nitrite layer of the solid body or sensing element manufactured according to the present invention, a figure of merit of $2.4 \times 10^{-12}$ m/V was found. As a comparison, the figure of merit for monocrystalline triglycine sulfate is $2.6 \times 10^{-12}$ m/V and for lanthan-doped lead-zirconate-titanate-ceramic (PLZT) less than $10^{-13}$ m/V (R. G. F. Taylor and H. A. H. Boot, Contemporary Physics, Vol. 14, 1973, p. 73).

The detectivity D* (E. H. Putley, loc. cit. p. 270), of pyroelectric radiation receivers lies in the region of $10^7$ to $10^9$ cm $Hz^{\frac{1}{2}}w^{-1}$ (E. H. Putley in "Optical and Infrared Detectors", edited by R. J. Keyes, Springer-Verlag, Berlin-Heidelberg-New York, 1977, p. 81). With a radiation detector utilizing a sensing element with a sodium nitrite layer as manufactured in the first embodiment above, a value of $D^* = 10^9$ cm $Hz^{\frac{1}{2}}w^{-1}$ was measured at a bandwidth of 10 Hz.

As the above described measurements show, the substrates covered with the crystalline sodium nitrite layers manufactured according to the present invention have good ferroelectric and pyroelectric characteristics. It is thus to be assumed that a certain amount of alignment of the sodium nitrite crystals within the layer occurs. In order that the characteristics may be quantitatively reproducible in different samples, either the initial conditions must be maintained the same or additional measures must be taken to affect the crystal orientation in the sodium nitrite layer. Several such methods will now be discussed.

In the first, a substrate with a tindioxide layer was produced in the shape of a wedge. A piece of sodium nitrite crystal approximately 1 mm×1 mm×1 mm in size was fastened to the tip of the wedge as seed crystal. It was so positioned that its crystallographic b-axis (ferroelectric axis which lies in the [010] direction) was perpendicular to the substrate. With the tip of the wedge at the top, the substrate was dipped into the sodium nitrite solution or melt. It was immersed to a depth such that the seed crystal was just wetted by the sodiun nitrite and began to dissolve at its bottom surface. At that point, the substrate was pulled out of the melt or solution with a speed of approximately 1 mm/sec. Upon crystallization, an orientation determined by the seed crystal resulted.

A second method for influencing the orientation of the sodium nitrite crystals is as follows. A substrate with a tin dioxide layer was pulled out of a sodium nitrite melt with a speed of 1 mm/sec. It was pulled past an electrically conductive surface which was close to the sodium nitrite melt but did not touch it. An electrically insulating spacing holder was used to maintain a distance of 0.2 mm to the substrate. A potential difference of 1,000 volts DC was maintained between the conductive surface and the tindioxide layer on the substrate. An electric field perpendicular to the substrate was thus created. The $NO_2$ groups of the sodium nitrite film on the substrate which were still mobile when entering the field were aligned by the electric field in such a way that upon crystallization their dipole moment was aligned parallel to the electric field, that is perpendicular to the substrate. Thus the spontaneous polarization of the sodium nitrite, which is determined by the dipole moment of the $NO_2$ groups, was also fixed in the direction perpendicular to the substrate.

Non-uniformly crystallized sodium nitrite layers were similarly oriented, by first placing them horizontally at a distance of 0.2 mm under an electrically conductive plate whereby they were heated above the melting point. They were then slowly cooled in the electric field, causing the correct orientation of the spontaneous polarization.

An orientation of the b-axis of the sodium nitrite layer perpendicular to the substrate was achieved by a microscopically fine grooving of the top surface of the substrate. A substrate comprising mica with a layer of tin dioxide was grooved by wiping along straight lines or rubbing with a paper handkerchief. The sodium nitrite layer applied either from a melt or from a solution of sodium nitrite was then oriented as stated above.

Recrystallization of sodium nitrite layers deposited on a substrate either from a solution or from a melt was achieved by moving the layer at a distance of 0.2 mm under an electrically heated platinum wire, the temperature of the wire being between 500 and 600 degrees centigrade. This caused the layer to be melted in a narrow zone under the wire and to solidify behind the wire. The process was repeated until a uniform crystal orientation was achieved.

A preferred embodiment of an infrared detector in accordance with the present invention is shown in FIGS. 4a-4c. FIG. 4a shows a vertical section through the detector, while FIGS. 4b and 4c are top views, respectively, of a plastic ring and of the substrate disc with its layers.

The sodium nitrite film 1 deposited from a solution or melt onto a mica substrate 5 within dioxide electrode 2 had gold vapor deposited thereon through a mask in a high vacuum. The so manufactured gold contacts 3 were circular, had a diameter of 3 mm and have a projection 3a on one side. A black gold precipitate 4 was applied to the gold contacts in a nitrogen atmosphere of 1 torr. The black gold precipitate has a high absorption capacity for electromagnetic radiation. Circular portions with a diameter of approximately 6 mm were blanked or punched out of the so-layered substrate. The resulting discs had a recess 15 at the edge. At a position 2a opposite projection 3a of gold contact 3, the sodium nitrite film was briefly heated over its melting point by an incandescent platinum wire. The liquid sodium nitrite film contracts and frees the tin dioxide layer 2 which forms the lower electrical contact of the sodium nitrite layer.

The disc shown in FIG. 4c was inserted into a plastic ring 6 (FIG. 4b) with the gold precipitate 4 facing downwards. The plastic ring has a wedge shaped projection 16 and is metal plated into positions 7, 7a. Reference numerals 17, 17a denote the locations at which electrically conductive adhesive drops were applied. These make electrical contact to the electrodes 2 and 3 at locations 2a and 3a when the disc pictured in FIG. 4c in inserted into the ring. Thereafter, a ring shaped spacer 8 and a cover plate 9, each made of plastic, were inserted into plastic ring 6. The resulting unit including parts 1-9 was inserted in a commercially available transistor housing. A large bore in the bottom of the housing was provided with a gas tight seal consisting of an electrically semiconducting silicon disc 11 glued by means of adhesive 20. The transistor housing was closed by a cover 12 which has two insulated through contacts 13, 14. The dimensions of the arrangement were such that contacts 13, 14 were electrically connected to the metallized layer 7 of the plastic ring 6 via adhesive drops 18 when the cover was inserted. Further, cover 12 has a projecting portion 19 which causes the parts within the housing to be pressed tightly together. The cover was then soldered to housing 10 in a gas tight fashion. Alternatively, it could be glued on with an electrically conductive glue.

The radiation passing through window 11 into the detector is absorbed by gold precipitate 4 and heats the sodium nitrite layer. This causes the temperature dependent spontaneous polarization of the sodium nitrite (pyroeffect) and a charge to appear at the electrodes. The latter serves as proof that radiation, and in particular high frequency modulated radiation or short radiation pulses, was sensed by the detector.

In another preferred embodiment of the invention, the substrate with its sodium nitrite layer is utilized in a vidicon television camera tube. For this purpose, the sodium nitrite is applied to an electrically conductive substrate or a substrate with an electrically conductive layer. No second electrode is applied to the sodium nitrite layer as was for the detector. An image of the object to be televised is formed on the sodium nitrite layer in the vidicon tube by the optical system of the television camera, causing localized heating in correspondence to the incident rays. The changes in charge on the sodium nitrite layer caused by the incident rays are then scanned with the electron beam of the camera tube.

Figure 5:
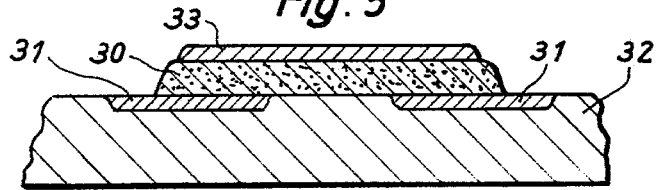
FIG. 5 shows a field effect transistor in accordance with the present invention.

A preferred embodiment of a field effect transistor in accordance with the present invention is shown in FIG. 5. For this application, the ferroelectric sodium nitrite layer serves as the gate insulator in an MIS (metal-insulator-semiconductor) field effect arrangement.

The conventional silicon field effect transistor in MOS (metal oxide silicone) form is so-constructed that silicon is covered with electrically insulating $SiO_2$. Metal is vapor deposited on the $SiO_2$ layer, the metal forming the gate contact. When a voltage is applied between the silicon and the gate contact which constitute the plates of a condensor, a charge is created in the silicon in correspondence to the capacitance of the so-formed capacitor. The charge in turn changes the charge carrier concentration in a narrow zone at the junction to the $SiO_2$ layer, thereby changing the conductivity. This change in conductivity changes the amplitude of the current flowing between two electrodes, spaced laterally apart on this silicon and extending underneath the metallized oxide layer, (source and drain contacts) for a constant applied voltage.

In FIG. 5 reference numeral 30 denotes the sodium nitrite layer used as gate insulator. In this arrangement, the sodium nitrite layer 30 replaces the function of the $SiO_2$ layer in the MOS transistor. Correspondingly, the preparation of the source and drain electrodes 41 is the same as in the MOS transistor. If as few changes as possible are to be made in the manufacturing process relative to the MOS transistors, the oxidation of silicon to $SiO_2$ can take place in the region of the gate electrode prior to the application of the sodium nitrite layer. Alternatively, the sodium nitrite layer can be applied directly to the silicon 32. Thereafter, a metal layer is vapor deposited through a mask onto the sodium nitrite layer 30 just as was the case with the $SiO_2$. The metal layer then forms the gate electrode 33. The source and drain electrodes which are still covered by $NaNO_2$, are freed by locally heating the $NaNO_2$ layer at the corresponding places above the melting point. The fluid film then contracts so that the electrodes are available for contacting by wires. The local heating over the melting point is accomplished by a $CO_2$ laser whose rays are applied through a mask so that only the source and drain electrodes are affected. The layering with $NaNO_2$ was effected by dipping a silicon structure 32 with source and drain electrodes 31 into a melt of $NaNO_2$ and then withdrawing the structure with a constant speed of 1 mm/sec. The temperature at the top surface of the melt was maintained approximately 5 degrees centigrade above the melting temperature of $NaNO_2$.

In contrast to insulators in the usual MIS arrangement, sodium nitrite is spontaneously polarized and thus creates additional charge carriers in the semiconductor substrate even without an applied gate voltage. The resistance of the semiconductor substrate is thus changed. Changes in spontaneous polarization brought about by voltage pulses at the gate electrode, or pressure or temperature changes, change the electrical resistance of the semiconductor substrate between the source and the drain electrode.

In the thin ferroelectric $NaNO_2$ layer of the arrrangement shown in FIG. 5, two stable polarization directions exist. The polarization vector can either point to the semiconductor substrate 32 whereby additional electrons are induced therein, or can be pointed away from the semiconductor substrate 32, creating additional holes. The two stable oppositely directed polarization directions in $NaNO_2$ therefore caused two different resistances to exist between source and drain electrodes 31.

This effect can be utilized for data storage. A short pulse of voltage applied between gate electrode 32 on the one hand and source or drain electrode 31 on the other hand causes one of the two possible polarization directions to exist beneath the gate electrode. This polarization direction remains stable without further applied voltage.

A disadvantage of all previously known ferroelectric field effect transistor arrangements is the lack of long-time stability in the semiconductor resistance changes caused by the spontaneous polarization of the ferroelectric material. The reason for this is a very high density of boundary surface states. Thus a read-out of the information stored in the form of the direction of the spontaneous polarization cannot be effected by means of the source-drain resistance after a relatively short time.

This difficulty is removed by a new read-out method. Specifically, the fact is utilized that the direction of spontaneous polarization changes with temperature. For rapid change in temperature (as fast or faster than changes in occupation of the boundary states) changes in source-drain resistance are created. For increases in temperature a decrease in the electron concentration results when the polarization vector points to the semiconductor, while increases in electron concentration occur if the polarization vector points away from the semiconductor. The required rapid temperature change in the semiconductor was achieved by a short time source-drain current of high amplitude or by external heating by absorption of radiation.

Since the absorption of radiation in a field effect arrangement as shown in FIG. 5 causes a change in the temperature dependent spontaneous polarization of the ferroelectric material $NaNO_2$, the resultant change in source drain resistance in the semiconductor can be utilized to determine the presence of radiation. Relative to the ferroelectric radiation detector described previously, in which the change in charge was detected by a voltage created across a high impedance, the field effect arrangement has the advantage of operating with a very small impedance.

While the invention has been illustrated in preferred embodiments, it is not to be limited to the circuits and structures shown, since many variations thereof will be evident to one skilled in the art and are intended to be encompassed in the present invention as set forth in the following claims.

We claim:

1. A method for producing a solid ferroelectric or pyroelectric body comprising the steps of
   depositing sodium nitrite in a liquid state onto a substrate to form a film having a thickness in the order of several microns; and
   crystallizing the so-deposited sodium nitrite by cooling.

2. A method as set forth in claim 1, wherein said sodium nitrite is in a molten state and the step of depositing sodium nitrite onto said substrate comprises first immersing said substrate in and subsequently pulling said substrate out of said sodium nitrite in said molten state.

3. A method as set forth in claim 1, wherein said substrate has a top surface; and wherein said step of depositing said sodium nitrite comprises depositing said sodium nitrite in said liquid state onto said top surface of said substrate, and rotating said substrate so that said sodium nitrite is evenly distributed over said top surface.

4. A method as set forth in claim 1, wherein said substrate has a top surface; further comprising the step of controlling the temperature distribution on said top surface so that said crystallizing of said so-deposited sodium nitrite starts at a predetermined point on said top surface.

5. A method as set forth in claim 1, further comprising the step of applying an electric field to said substrate during said crystallizing of said so-deposited sodium nitrite.

6. A method as set forth in claim 1, wherein said substrate is an insulator having an electrically conductive layer.

7. A method as set forth in claim 1, further comprising the step of depositing at least one electrode on said crystallized sodium nitrite film.

8. A method as set forth in claim 1, further comprising the step of covering said sodium nitrite crystallized film with a radiation absorbent/layer.

9. A method as set forth in claim 1, wherein said step of depositing said sodium nitrite comprises depositing said sodium nitrite on a substrate transparent to radiation.

10. A method as set forth in claim 1, further comprising the step of depositing a gate-electrode onto said sodium nitrite film thereby creating an MIS field effect transistor.

11. A method as set forth in claim 2, wherein said sodium has a melting point; further comprising the step of maintaining said molten sodium nitrite within a temperature range of 10 degrees centigrade above said melting point while pulling said substrate out of said molten sodium nitrite.

12. A method as set forth in claim 1, further comprising the step of moving a heating element relative to said sodium nitrite film to heat localized portions thereof in sequence until all parts of said layer are molten, and subsequently cooling said layer, whereby a uniform crystalline orientation is created throughout said layer.

13. A method as set forth in claim 1, wherein said substrate is made of electrically insulating material; further comprising the step of depositing a layer of semiconductor material on said substrate prior to said depositing of said sodium nitrite.

14. A method as set forth in claim 13, wherein said semiconductor material is cassiterite.

15. A method as set forth in claim 13, wherein said semiconductor material is indium oxide.

16. A method as set forth in claim 13, wherein said semiconductor material is a mixture of cassiterite and indium oxide.

17. A method as set forth in claim 13, wherein said substrate is a mica substrate.

18. A method as set forth in claim 2, wherein said substrate has a top surface; further comprising the step of creating a microscopic grooved structure in said top surface prior to said immersing.

19. A method as set forth in claim 18, wherein said step of creating said microscopic grooved structure comprises creating a microscopic grooved structure by rubbing said top surface.

20. A method as set forth in claim 18, wherein said step of creating said microscopic grooved surface comprises the step of mechanically stressing said substrate.

21. A method as set forth in claim 19, wherein said step of mechanically stressing said substrate comprises stretching said substrate.

22. A method as set forth in claim 19, wherein said step of mechanically stressing said substrate comprises bending said substrate.

23. A method as set forth in claim 1, wherein said substrate is a conductive or a semiconductive substrate.

24. A method as set forth in claim 1, wherein said substrate has a top surface; further comprising the step of mounting a crystal having a ferroelectric axis oriented in said predetermined direction to said substrate on said substrate prior to said crystallizing step.

25. Method for producing a solid ferroelectric or pyroelectric body comprising the steps of creating a tindioxide layer constituting an electrode on a mica substrate;

depositing sodium nitrite in a liquid state onto said substrate with said electrode;

orienting the crystals in said sodium nitrite so that the spontaneous polarization thereof extends at least in part in a predetermined direction relative to said substrate; and crystallizing the so-oriented sodium nitrite.

26. A method as set forth in claim 25, wherein said step of orienting said crystals in said sodium nitrite comprises applying an electric field to said substrate with said nitrite, and in a direction perpendicular thereto.

27. A method as set forth in claim 26, wherein said sodium nitrite in a liquid state comprises sodium nitrite in a molten state.

28. A method as set forth in claim 26, wherein said sodium nitrite in a liquid state comprises sodium nitrite in a solution.

29. A method as set forth in claim 26, wherein said step of crystallizing the so-deposited sodium nitrite comprises cooling the so-moistened substrate.

30. A method as set forth in claim 26, wherein said step of crystallizing the so-deposited sodium nitrite comprises drying the so-moistened substrate.

* * * * *